United States Patent
Chang et al.

(10) Patent No.: US 12,301,198 B2
(45) Date of Patent: May 13, 2025

(54) PHOTOCONDUCTIVE SEMICONDUCTOR-BASED STUB TUNERS FOR HIGH POWER

(71) Applicant: Lawrence Livermore National Security, LLC, Livermore, CA (US)

(72) Inventors: Tammy Chang, San Ramon, CA (US); Lars F. Voss, Livermore, CA (US); Joseph D. Schneider, Livermore, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 360 days.

(21) Appl. No.: 17/564,110

(22) Filed: Dec. 28, 2021

(65) Prior Publication Data

US 2023/0216469 A1    Jul. 6, 2023

Related U.S. Application Data

(60) Provisional application No. 63/274,870, filed on Nov. 2, 2021.

(51) Int. Cl.
*H03H 7/38* (2006.01)
*H01P 1/12* (2006.01)
*H01P 1/203* (2006.01)
*H03H 7/40* (2006.01)

(52) U.S. Cl.
CPC .............. *H03H 7/40* (2013.01); *H01P 1/127* (2013.01); *H01P 1/2039* (2013.01); *H03H 7/38* (2013.01)

(58) Field of Classification Search
CPC .. H03H 7/38; H03H 7/40; H01P 1/127; H01P 1/2039; H01P 1/203

USPC ........................................................... 333/33
See application file for complete search history.

(56) References Cited

U.S. PATENT DOCUMENTS

| | | | | |
|---|---|---|---|---|
| 5,116,807 | A | * | 5/1992 | Romanofsky ........... H01P 1/185 505/202 |
| 5,808,527 | A | * | 9/1998 | De Los Santos ......... H03F 3/60 333/263 |
| 6,043,727 | A | * | 3/2000 | Warneke ............... H01P 1/2039 333/205 |

(Continued)

OTHER PUBLICATIONS

Phase Shifter Line Stretcher High Power. https://www.atmmicrowave.com/waveguide/phase-shifter-line-stretcher-highpower/(accessed Jul. 28, 2021).

(Continued)

*Primary Examiner* — Stephen E. Jones
(74) *Attorney, Agent, or Firm* — Perkins Coie LLP

(57) ABSTRACT

Disclosed are apparatuses and methods of tuning a radio frequency circuit using stub tuners and photoconductive switches. In one aspect an electromagnetic stub tuner apparatus is disclosed. the apparatus includes a transmission line, and a photoconductive switch positioned along the length of the transmission line. The photoconductive switch is configured to turn on or turn off, wherein an impedance of the transmission line is changed when the photoconductive switch is turned on compared to when the photoconductive switch is turned off. In another aspect, a method of tuning a radio frequency circuit is disclosed. In yet another aspect, a method of producing a radio frequency tuning circuit is disclosed.

19 Claims, 7 Drawing Sheets

(56) References Cited

U.S. PATENT DOCUMENTS

2010/0176962 A1\* 7/2010 Yossef .................. H04Q 1/136
709/224
2021/0181702 A1\* 6/2021 Brown ............... G05B 19/0425

OTHER PUBLICATIONS

J. Benford, "History and future of the relativistic magnetron, " in 2010 International Conference on the Origins and Evolution of the Cavity Magnetron, Apr. 2010, pp. 40-45. doi: 10.1109/CAVMAG.2010.5565566.

M. Chen, C.-C. Chen, and J. L. Volakis, "Reconfigurable 800-1500MHz double stub tuner using MEMS capacitive switches," in 2013 IEEE Antennas and Propagation Society International Symposium (APSURSI), Jul. 2013, pp. 2157-2158. doi: 10.1109/APS.2013.6711737.

R. Quaglia, C. M. Andersson, C. Fager, and M. Pirola, "A double stub impedance tuner with SiC diode varactors," in Asia-Pacific Microwave Conference 2011, Dec. 2011, pp. 267-270.

V. Bilik and J. Bezek, "Investigation of High-Power Limits of Stub Tuners by Means of Electromagnetic Simulation," in 2008 14th Conference on Microwave Techniques, Apr. 2008, pp. 1-4. doi: 10.1109/COMITE.2008.4569901.

\* cited by examiner

700

710 — Receiving an input radio frequency signal at an input port coupled to a first end of a transmission line 720 — Activating one or more photoconductive switches located along the transmission line and at one or more transmission line stub tuners located along the transmission line 730 — Producing an output radio frequency signal at an output port coupled to a second end of the transmission line, wherein the one or more activated photoconductive switches cause a first impedance at a first frequency at the input port and a second impedance at the first frequency at the output port

FIG. 7

PHOTOCONDUCTIVE SEMICONDUCTOR-BASED STUB TUNERS FOR HIGH POWER

CROSS REFERENCE TO RELATED APPLICATIONS

This patent document claims the benefit of priority to U.S. Patent Application No. 63/274,870, filed on Nov. 2, 2021. The entire contents of the before-mentioned patent application is incorporated by reference as part of the disclosure of this application.

FEDERALLY SPONSORED RESEARCH OR DEVELOPMENT

This invention was made with Government support under Contract No. DE-AC52-07NA27344 awarded by the United States Department of Energy. The Government has certain rights in the invention.

TECHNICAL FIELD

The present disclosure relates to photoconductive switches used in radio-frequency and RF circuits.

BACKGROUND

Narrowband microwave systems often leverage resonant circuits to optimize the transmit or receive gain of the system. However, these designs are not useful outside of a narrow frequency band, while wideband designs generally suffer from lower system gain. New techniques are needed to provide wideband matching with high system gain.

SUMMARY

Disclosed are apparatuses and methods of tuning a radio frequency circuit using stub tuners and photoconductive switches. In one aspect an electromagnetic stub tuner apparatus is disclosed. The apparatus includes a transmission line, and a photoconductive switch positioned along the length of the transmission line. The photoconductive switch is configured to turn on or turn off, wherein an impedance of the transmission line is changed when the photoconductive switch is turned on compared to when the photoconductive switch is turned off.

In another aspect, a method of tuning a radio frequency circuit is disclosed. The method includes receiving an input radio frequency signal at an input port coupled to a first end of a transmission line, and activating one or more photoconductive switches located along the transmission line and at one or more transmission line stub tuners located along the transmission line. The method further includes producing an output radio frequency signal at an output port coupled to a second end of the transmission line. The one or more activated photoconductive switches cause a first impedance at the input port and a second impedance at the output port. The first and second impedances are produced at a first frequency.

In yet another aspect, a method of producing a radio frequency tuning circuit is disclosed. The method includes selecting a stub tuner topology for a radio frequency tuning circuit, wherein the stub tuner topology includes one of more tuning stubs selectively connected to a transmission line via one or more photoconductive switches in the radio frequency tuning circuit. Each of the one or more tuning stubs is connected to the transmission line in response to a different corresponding optical signal. The method further includes selecting, for each of the one or more tuning stubs, whether the tuning stub is in a series configuration or a shunt configuration.

BRIEF DESCRIPTION OF THE DRAWINGS

FIG. 7 depicts a process, in accordance with some example embodiments.

DETAILED DESCRIPTION

Figure 1:
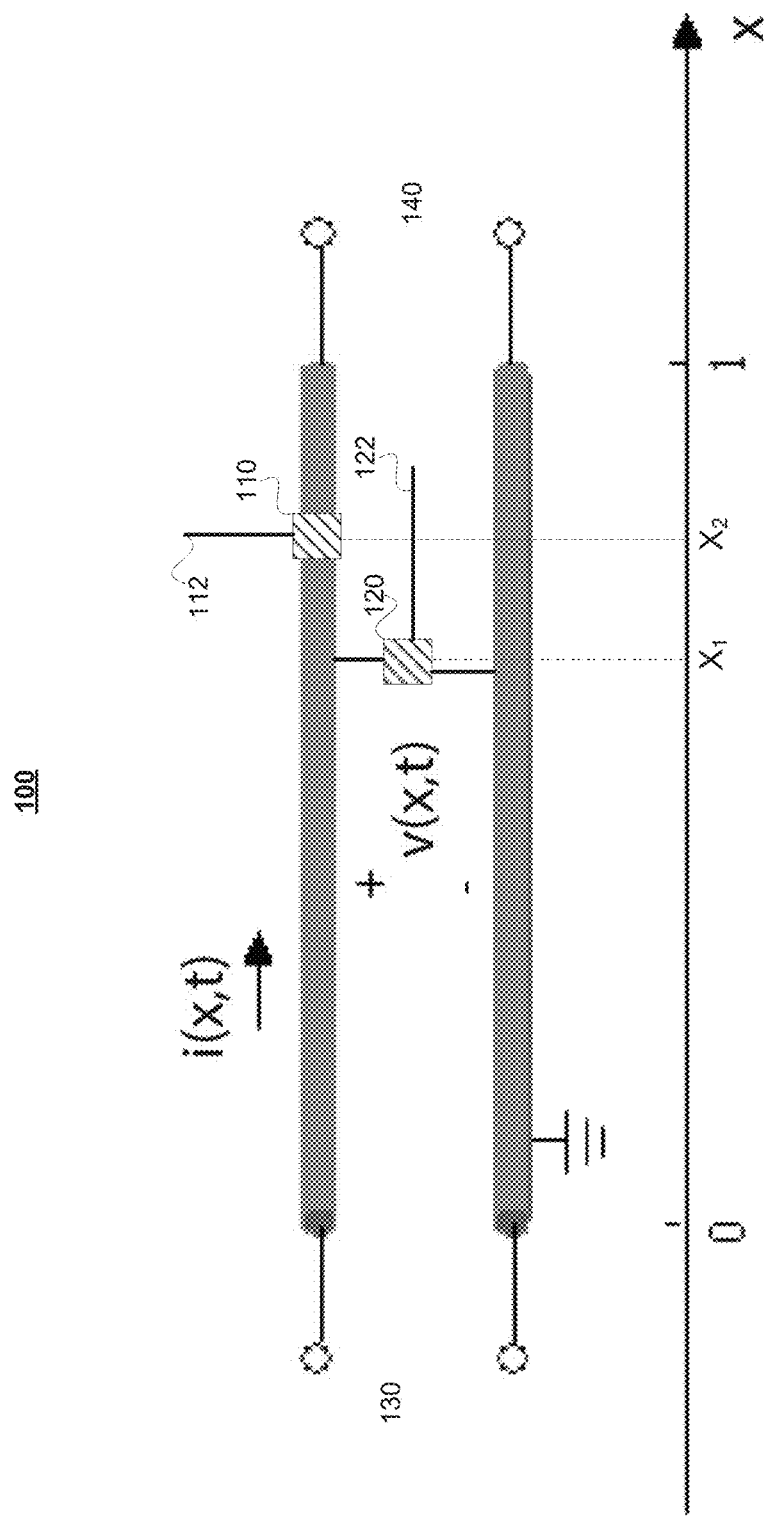
FIG. 1 depicts an example of a transmission line.

In microwave circuit design, stub tuners are used to match load impedances so as to allow for maximum power transfer between a generator and load, or to introduce a mismatch into an otherwise impedance matched system. They can consist of one or more transmission lines that have tunable lengths and are each terminated with an open or short-circuited load. Despite the importance of performance tunability in high power microwave design, appropriate mechanisms for stub tuning are limited, due to the need to withstand high electric fields. Disclosed is a stub tuning approach for high power electromagnetic design, which utilizes photoconductive semiconductor switching to withstand extremely high electric fields. Photoconductive semiconductor material is placed along lengths of transmission line. Optical waveguides can be used to switch selected areas to on or off in order to tune the effective length of the transmission line by creating an effective short or open circuit along the transmission line.

The disclosed subject matter has applications in various fields such as, for example, directed energy and effects testing; high power radar and communications; long-range communication and radar for, e.g., disaster and rescue missions; industrial microwave heating and/or curing (e.g. of dielectric materials such as ceramics and/or polymers); pulsed power and particle accelerator applications; power amplifiers for communications and radar applications, and other applications requiring impedance tunability of a circuit such as impedance matching circuits.

Narrowband microwave systems often leverage resonant circuits to optimize the transmit or receive gain of the system. However, these designs are not useful outside of a narrow frequency band, while wideband designs generally suffer from lower system gain. As such, mechanisms have been designed to allow for narrowband frequency tunability across a wider bandwidth by tuning the resonant elements of a microwave circuit. Common mechanisms for narrowband frequency tuning involve the use of variable circuit elements, such as varactors or other electronic phase shifting elements, or mechanical means by which transmission line lengths are physically extended or reduced.

In addition to its use for tuning the resonant frequency of a microwave system, microwave power amplifier performance across multiple parameters (in addition to frequency) can be varied using tunable elements such as those disclosed herein. Generally speaking, radio frequency (or microwave) power amplifier behavior can be determined by the load termination at the fundamental frequency and harmonic frequencies. Correspondingly, the output termination can be designed based on the desired output power, gain, efficiency, and/or linearity, and their corresponding tradeoffs. Tunable impedance matching networks at the power amplifier output can be used to establish the optimum load condition for a target figure of merit.

Although low power mechanisms for frequency tuning can be achieved via electronic tuning, electronically tunable approaches for high power are limited. Previously, silicon carbide diode varactors have been implemented for amplifier power output handling, however operational voltages are not described. Alternatively, mechanical tuning has been used to stretch and contract transmission line lengths (either manually or motor-controlled) for waveguide systems, and their ability to handle 10 s of kilowatts continuous-wave has been demonstrated in literature. Some systems cite as high as several megawatts of peak power handling. This type of mechanical tuning mechanism has been demonstrated to achieve tunable cavity magnetron systems. However, these mechanisms are bulky in size and slow to tune. The disclosed embodiments address the foregoing challenges with designs that involve the following:

a) Photoconductive semiconductor materials for optoelectronic switching (e.g., silicon carbide, gallium nitride, gallium arsenide, gallium oxide, aluminum nitride, and silicon based photoconductive switches);

b) Optical excitation to vary the resistivity of the photoconductive material, which can be an optical waveguide for low electromagnetic interference; and c) The integration of the switching material and optical excitation method into a radio frequency and/or microwave transmission line to produce a high power handling, compact, and high-speed stub tuner.

Disclosed are devices using photoconductive semiconductors to dynamically tune transmission line lengths controlled by optical excitation. This offers the benefits of handling high electric fields as well as fast turn-on times (as low as 10 s of picoseconds). Materials with high responsivity at optical wavelengths such as silicon or gallium arsenide semiconductors can be used as the photoconductive material (and the other materials listed above).

FIG. 1 at shows a schematic transmission line 100 with left side 130 and right side 140. A current in the transmission line, i(x,t), is a function of position, x, and time, t. The transmission line has a normalized length of 1. A voltage across the transmission line, v(x,t) is a function of position, x, and time, t.

At a position, $X_1$, along the length of the transmission line, a photoconductive switch 120 is connected in a shunt configuration. When light is present at the input 122 to the photoconductive switch 120, the switch is turned-on causing a short in the transmission line at position $X_1$. The short at $X_1$ will cause the reflection of an incoming wave from 130 or 140. When no light is present at input 122, the photoconductive switch will be turned-off causing the switch to be open-circuited. The open circuit at $X_1$ will cause no perturbation of an incoming wave.

At a position, $X_2$, along the length of the transmission line, a photoconductive switch 110 is connected in a series configuration. When light is present at the input 112 to the photoconductive switch, the switch is turned-on connecting the transmission line on the right side of photoconductive switch 110 at position $X_2$ to the transmission line on the left side of photoconductive switch 110 at position $X_2$. Turning-on the photoconductive switch 110 at position $X_2$ lengthens the transmission line. When no light is present at input 112, the photoconductive switch will be turned-off causing the switch to be open-circuited. The open circuit at $X_2$ will cause a disconnection of the transmission line to the left of $X_2$ from the transmission line to the right of $X_2$. The open circuit of photoconductive switch 110 will cause a reflection of an incoming wave from 130 or 140.

In the example of FIG. 1, by controlling the light inputs at 112 and 122, the transmission line length can be changed via series photoconductive switch 110 and/or a short can be introduced in the transmission line at $X_1$ via shunt photoconductive switch 120. In the example of FIG. 1, and used throughout this document, the photoconductive switches are turned on when light is present and turned off when light is absent, but without a loss in generality photoconductive switches could be used that are turned on when no light is present and turned off when light is present.

Figure 2:
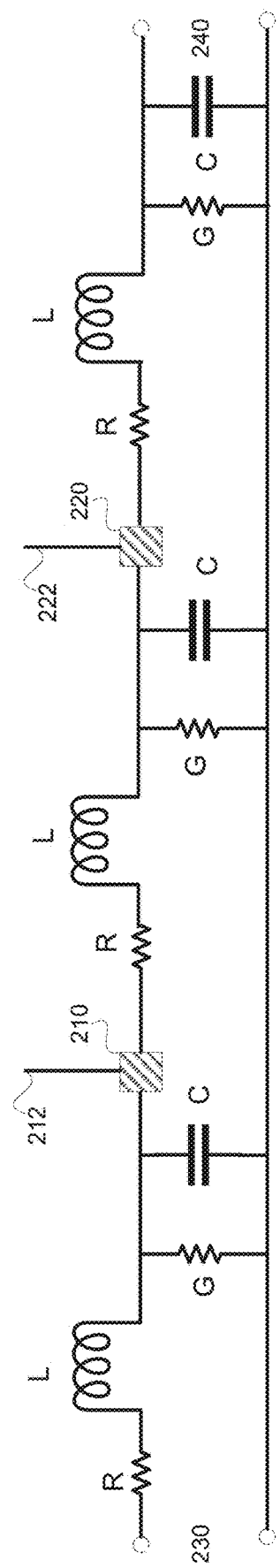
FIG. 2 depicts an example of a lumped circuit model of a transmission line with photoconductive switches placed in various locations along the transmission line.

FIG. 2 shows a lumped circuit element model of a transmission line 200 with three segments, each segment having a corresponding series resistance (R), series inductance (L), shunt capacitance (C), and shunt conductance (G). Shown in FIG. 2 are series photoconductive switches 210 and 220. As an illustrative example, a signal propagating along the transmission from the left side at 230 toward the right side at 240 first encounters photoconductive switch 210. If photoconductive switch 210 is turned off, the transmission line length corresponds to the length of the first segment. If photoconductive switch 210 is turned on and photoconductive switch 220 is turned off, the transmission line length corresponds to the second segment length added to the first segment length. If photoconductive switch 210 is turned on and photoconductive switch 220 is turned on, the transmission line length corresponds to the third segment length added to the second segment length added to the first segment length. Light input 212 controls whether photoconductive switch 210 is on or off, and light input 222 controls whether photoconductive switch 220 is on or off. In this way the length of a transmission line can be controlled by photoconductive switches via optical inputs 212 and 222. For example, light can enter in via small optical waveguides (e.g. optical fiber) to maintain minimal electromagnetic interference with the transmission line. Although the example shown in FIG. 2 shows series photoconductive switches, shunt photoconductive switches can be used instead of series switches or in addition to series switches in a circuit.

Figure 3:
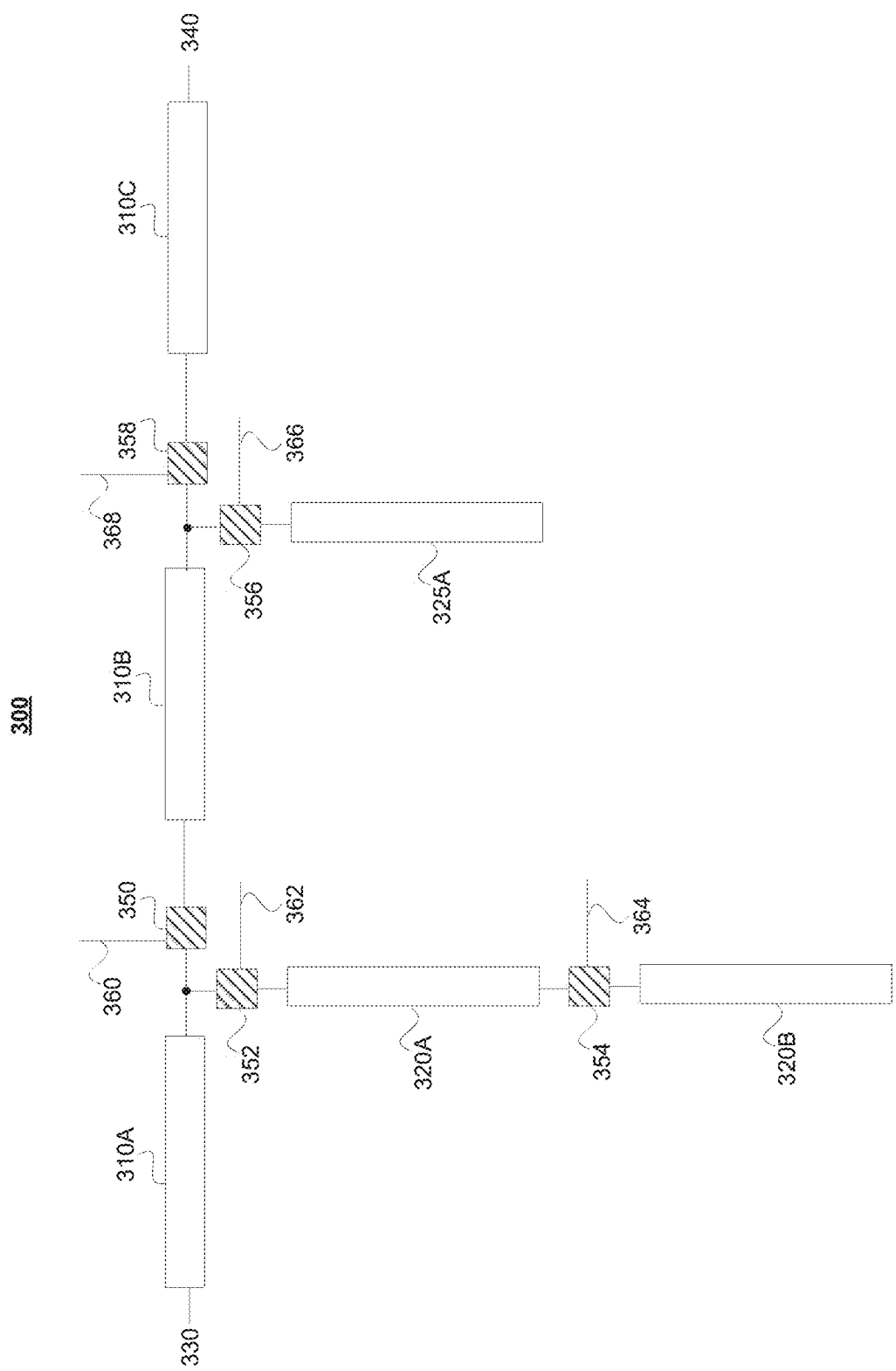
FIG. 3 depicts an example of sections of transmission line including stub tuners that can be switched into the circuit via photoconductive switches.

FIG. 3 shows an example of a transmission line network 300 configured with stub tuners. For example, an input signal at port 330 first passes through transmission line segment 310A. Next the input signal is incident on photoconductive switches 350 and 352. With photoconductive switches 350 and 352 both turned off, the input signal does not propagate beyond the transmission line segment 310A which is open-circuited at the end of 310A (right side of 310A). With photoconductive switch 350 turned off and photoconductive switch 352 turned on, the input signal propagates through 310A, through photoconductive switch 352 (and not along the transmission line network through photoconductive switch 350), through transmission line segment 320A to an open circuit if photoconductive switch 354 is off or through photoconductive switch 354 and transmission line segment 320B to an open circuit if photoconductive switch 354 is turned on. With photoconductive switch 352 turned off and photoconductive switch 350 turned on, the signal propagates through transmission line segment 310A, through photoconductive switch 350 and transmission line segment 310B. If photoconductive switches 350 and 352 are turned on, transmission line segments 320A and 320B (if photoconductive switch 354 is also turned on) are a stub tuner with a predetermined impedance value determined by the length of transmission line segment 320A, or the combined length of transmission line segments 320A and 320B if photoconductive switch 354 is turned on. With photoconductive switches 350 and 352 turned on and photoconductive switches 356 mand 358 turned off, transmission line segment 310B is another stub tuner with impedance determined by the length of 310B. With photoconductive switches 350, 356, 358 and optionally 353 turned on, transmission line segment 325A is a stub tuner with impedance determined by the length of 325A, and the signal propagates through transmission line segment 310C to port 340. Photoconductive switches 350, 352, 356, and 358 are controlled by optical signals such as optical signals carried by optical fibers 360, 362, 364, 366, and 368, respectively. In the preceding example, a signal propagated from port 330 to port 340. A signal could also propagate from port 340 to port 330.

Figure 4:
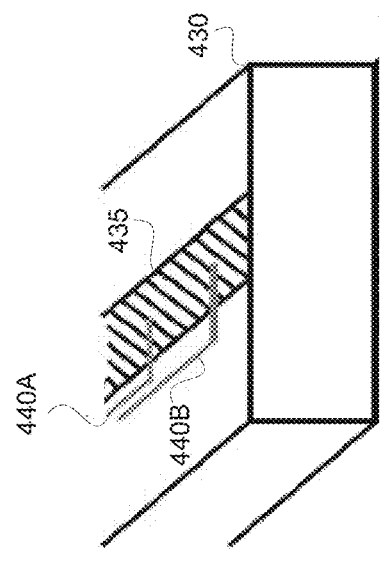
FIG. 4 depicts examples of microstrip transmission line with photoconductive switches.
Figure 4:
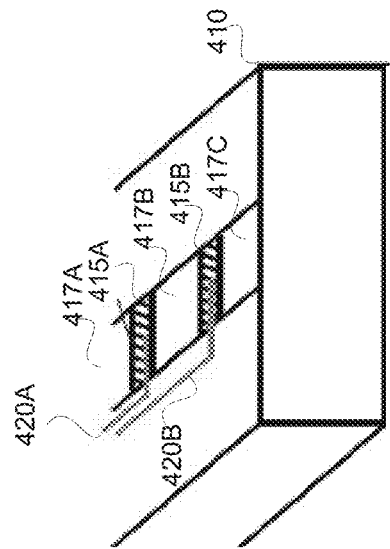
Figure 5:
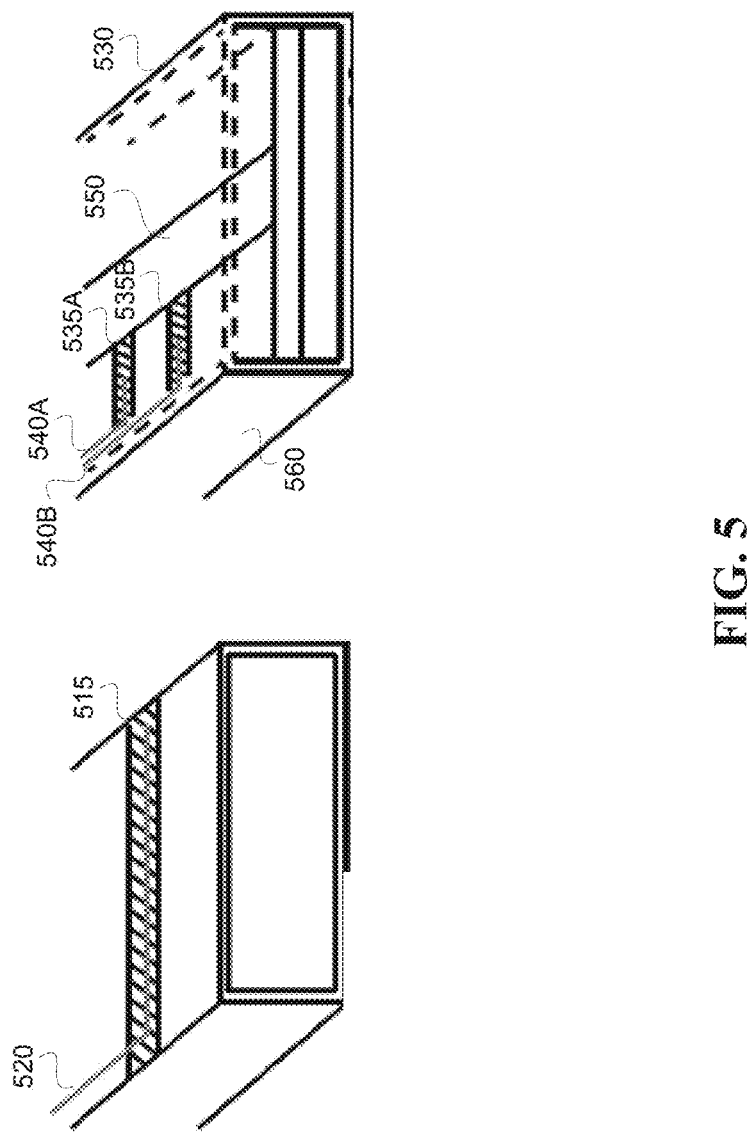
FIG. 5 depicts examples of a suspended stripline transmission line and rectangular waveguide with photoconductive switches.
Figure 6:
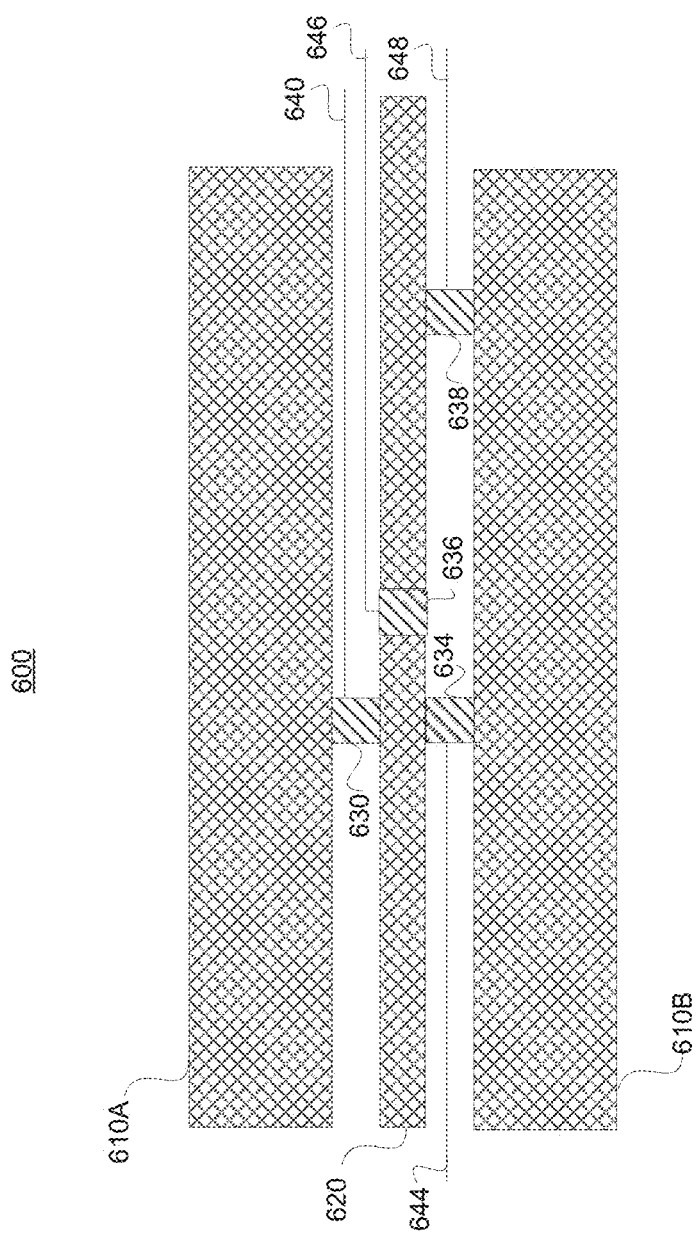
FIG. 6 depicts an example of a coplanar waveguide transmission with photoconductive switches.

The transmission lines in FIGS. 1-3 can be implemented as one or more of the specific transmission line topologies further detailed in FIGS. 4-6 as well as other transmission line topologies.

FIG. 4 depicts examples of microstrip transmission lines with photoconductive switches. Discrete microstrip transmission line 410 includes transmission line segments 417A, 417B, and 417C connected in series with photoconductive switches 415A and 415B between the transmission line segments. The photoconductive switches 415A and 415B are controlled by optical signals carried by optical fibers or waveguides 420A and 420B, respectively. Turning on photoconductive switch 415A lengthens transmission line 417A by the length of 417B, and further turning on photoconductive switch 415B further lengthens the transmission lines 417A and 417B by the length of transmission line 417C. Thus, the two switches 415A and 415B can be switched on or off to lengthen or shorten the microstrip transmission line via optical inputs. The discrete microstrip approach involves segmented sections of photoconductive semiconductor that can be switched on and off by an LED or other optical source including a waveguide-based optical source. Instead of using optical fibers to deliver the optical signals, other optical waveguide can be used including optical waveguides integrated into the transmission line structure.

Shown at 430 is an example of a continuous microstrip transmission line where an extended length of the top conductor of the transmission line is photoconductive material 435. Due to the semiconductor properties of the photoconductive material, the length of the photoconductive material affected by each optical input such as optical inputs 440A and 440B are limited in distance so that the photoconductive material is turned on for a predetermined distance along the transmission line and is turned off farther away from the light source than the predetermined distance even when the corresponding light source is on. The continuous microstrip can be used for finer length tuning. For example, when optical input 440A is on, the photoconductive may be turned off at a shorter distance from 44A than the location of optical input 440B, but with optical inputs 440A and 44B are on, the photoconductive material may be turned-on for the full length shown at 430.

FIG. 5 at 510 shows an example of a rectangular waveguide with photoconductive material 515 replacing a portion of the top surface. In this example, when the photoconductive material is turned on by an optical input 520, the waveguide behaves normally. When the photoconductive material 515 is turned off (no optical input), the open circuited photoconductive portion causes a perturbation in the propagating fields thereby changing the impedance at the location of the photoconductive material. In this rectangular waveguide example, the area of the highest electric fields (e.g. top and bottom side of the waveguide) can be interrupted based on a desired open or short circuit configuration. In some example embodiments, photoconductive material may replace more surfaces of the waveguide.

FIG. 5 at 530 shows an example of a stripline suspended in a rectangular waveguide. One or more photoconductive switches such as photoconductive switches 535A and 535B can be connected at one or more locations between the stripline center conductor 550 and the wall of the waveguide 560. The suspended stripline, is amenable to confined high power microwave transmission, and can be shorted to the sidewalls (electrical ground) via the photoconductive switches being located between the transmission line and outer housing wall as shown. Photoconductive switches 535A and 535B are configured as shunt switches. Series switches (not shown) as detailed in this document can be used along the length of the stripline center conductor instead of, or in addition to, shunt photoconductive switches 535A and 535B. The waveguides shown at 510 and 530 can be made from a metal, an alloy, another conductive material, or a dielectric material.

FIG. 6 shows an example 600 of a coplanar waveguide (CPW) transmission line. CPW includes ground conductors 610A and 610B and signal conductor 620. The ground conductors and center conductor can be affixed to a dielectric material or can be suspended. Shown in the example of FIG. 6 are shunt photoconductive switches 630, 634, and 638 with corresponding optical inputs 640, 644, and 648, and series photoconductive switch 636 with corresponding optical input 646. When turned on, shunt photoconductive switches 630 and 634 connect both ground conductors 610A and 610B to the center conductor 620 providing a short circuit at the location of the switches. Shunt photoconductive switch 638 connects ground conductor 610B to center conductor 620 with no companion photoconductive switch connecting ground conductor 610A to center conductor 620. Also shown is series photoconductive switch 636 that when turned on allows propagation through the switch and when turned off provides an open circuit at the location of the switch 636.

FIG. 7 depicts a process for tuning a radio frequency circuit, in accordance with some example embodiments. At 710, the process includes receiving an input radio frequency signal at an input port coupled to a first end of a transmission line. At 720, the process includes activating one or more photoconductive switches located along the transmission line and at one or more transmission line stub tuners located along the transmission line. At 730, the process includes producing an output radio frequency signal at an output port coupled to a second end of the transmission line. The one or more activated photoconductive switches cause a first impedance at the input port and a second impedance at the output port. The first and second impedances are produced at a first frequency.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Only a few implementations and examples are described and other implementations, enhancements and variations can be made based on what is described and illustrated in this patent document. Moreover, the separation of various system components in the embodiments described in this patent document should not be understood as requiring such separation in all embodiments.

What is claimed is:

1. An electromagnetic stub tuner apparatus comprising:
a transmission line operable in a microwave or radio frequency range; and
a photoconductive switch positioned along a length of the transmission line and configured to turn on or turn off, wherein an impedance of the transmission line is changed when the photoconductive switch is turned on compared to when the photoconductive switch is turned off, wherein the electromagnetic stub tuner apparatus is operable at high powers of at least tens of kilowatts.

2. The electromagnetic stub tuner apparatus of claim 1, wherein the photoconductive switch is in a series circuit configuration.

3. The electromagnetic stub tuner apparatus of claim 1, wherein the photoconductive switch is in a shunt circuit configuration.

4. The electromagnetic stub tuner apparatus of claim 1, wherein the transmission line comprises one of a microstrip, a stripline, a coplanar waveguide, or a rectangular waveguide.

5. The electromagnetic stub tuner apparatus of claim 1, wherein the photoconductive switch comprises:
silicon carbide;
gallium nitride;
gallium arsenide;
gallium oxide;
aluminum nitride; or
silicon.

6. The electromagnetic stub tuner apparatus of claim 1, wherein the photoconductive switch has an associated optical input configured to receive light from a light source via a waveguide, wherein the photoconductive switch is configured to be turned on and conducting in a presence of light incident on the photoconductive switch and the photoconductive switch is configured to be turned off and not conducting in an absence of the light incident thereon.

7. The electromagnetic stub tuner apparatus of claim 6, wherein the light is generated by an LED or a laser and the waveguide is an optical fiber.

8. The electromagnetic stub tuner apparatus of claim 1, wherein the stub tuner is implemented as part of a radio frequency circuit and is operable to expand a bandwidth capability of the radio frequency circuit.

9. The electromagnetic stub tuner apparatus of claim 1, further comprising:
a second photoconductive switch positioned along the length of the transmission line and configured to turn on or turn off, wherein the impedance of the transmission line is changed when the second photoconductive switch is turned on compared to when the second photoconductive switch is turned off.

10. An electromagnetic stub tuner apparatus, comprising:
a transmission line operable in a microwave or radio frequency range; and
a photoconductive switch positioned along a length of the transmission line and configured to turn on or turn off, wherein an impedance of the transmission line is changed when the photoconductive switch is turned on compared to when the photoconductive switch is turned off, wherein:
the photoconductive switch is a first photoconductive switch that is in a series configuration with respect to the transmission line at a first location along the transmission line and is configured, when turned on, to extend an effective length of the transmission line beyond the first location,
the electromagnetic stub tuner apparatus comprises a second photoconductive switch that is in a shunt configuration with respect to the transmission line at a second location along the transmission line, and is configured to, when turned on, provide a connection to a ground at the second location, and
the first and the second photoconductive switches are configured to be selectively turned on or off to produce a predetermined impedance in the microwave range.

11. The electromagnetic stub tuner apparatus of claim 10, wherein electromagnetic stub tuner apparatus is operable at high powers of at least tens of kilowatts.

12. The electromagnetic stub tuner apparatus of claim 10, wherein one or more of the photoconductive switches comprises:
silicon carbide;
gallium nitride;
gallium arsenide;
gallium oxide;
aluminum nitride; or
silicon.

13. The electromagnetic stub tuner apparatus of claim 10, wherein the stub tuner is implemented as part of a radio frequency circuit and is operable to expand a bandwidth capability of the radio frequency circuit.

14. The electromagnetic stub tuner apparatus of claim 10, wherein the transmission line comprises one of a microstrip, a stripline, a coplanar waveguide, or a rectangular waveguide.

15. An electromagnetic stub tuner apparatus, comprising:
a transmission line operable in a microwave or radio frequency range; and
a photoconductive switch positioned along a length of the transmission line and configured to turn on or turn off, wherein an impedance of the transmission line is changed when the photoconductive switch is turned on compared to when the photoconductive switch is turned off, wherein:
the electromagnetic stub tuner apparatus is implemented as part of a coplanar waveguide that includes two ground conductors and a signal conductor,
the photoconductive switch is a first photoconductive switch that is in a series configuration with respect to the signal conductor at a first location along the coplanar waveguide,
the electromagnetic stub tuner apparatus comprises a second, a third and a fourth photoconductive switch that are in a shunt configuration with respect to signal conductor, the second and the third photoconductive switch are positioned at a second location along the coplanar waveguide, and the fourth photoconductive switch is positioned at a second location along the coplanar waveguide, and the first through the fourth photoconductive switches are configured to be selectively turned on or off to produce a predetermined impedance in the microwave range.

16. The electromagnetic stub tuner apparatus of claim 15, wherein one or more of the photoconductive switches comprises:
   silicon carbide;
   gallium nitride;
   gallium arsenide;
   gallium oxide;
   aluminum nitride; or
   silicon.

17. The electromagnetic stub tuner apparatus of claim 15, wherein the stub tuner is implemented as part of a radio frequency circuit and is operable to expand a bandwidth capability of the radio frequency circuit.

18. The electromagnetic stub tuner apparatus of claim 15, wherein the transmission line comprises one of a microstrip, a stripline, a coplanar waveguide, or a rectangular waveguide.

19. The electromagnetic stub tuner apparatus of claim 15, wherein electromagnetic stub tuner apparatus is operable at high powers of at least tens of kilowatts.

* * * * *